United States Patent [19]

Iwata et al.

[11] 4,024,567
[45] May 17, 1977

[54] SEMICONDUCTOR DEVICE HAVING AL-MN OR AL-MN-SI ALLOY ELECTRODES

[75] Inventors: Seiichi Iwata, Sayama; Akitoshi Ishizaka, Kokubunji; Hiroshi Yamamoto, Tokyo, all of Japan

[73] Assignee: Hitachi, Ltd., Japan

[22] Filed: June 4, 1976

[21] Appl. No.: 692,638

[30] Foreign Application Priority Data

June 4, 1975 Japan .............................. 50-66545

[52] U.S. Cl. ................................. 357/67; 357/65; 357/71; 427/90; 428/653
[51] Int. Cl.² ................. H01L 23/48; H01L 29/40; H01L 23/48; H01L 29/46
[58] Field of Search .................. 357/65, 71, 67; 29/196.2, 198; 427/90

[56] References Cited

UNITED STATES PATENTS

| | | | |
|---|---|---|---|
| 3,570,001 | 3/1971 | Papendrecht et al. ............. | 357/67 |
| 3,607,479 | 9/1971 | Murrmann .......................... | 357/67 |
| 3,633,076 | 1/1972 | Arndt ................................. | 357/67 |
| 3,922,385 | 11/1975 | Konantz et al. .................... | 357/67 |

*Primary Examiner*—Andrew J. James
*Attorney, Agent, or Firm*—Craig & Antonelli

[57] ABSTRACT

A semiconductor device has a conductive layer for wiring which is made of an Al alloy containing Mn in an amount greater than 1 percent by weight and below 6 percent by weight. The semiconductor device has excellent corrosion resistance, and has a high reliability.

19 Claims, 11 Drawing Figures

SEMICONDUCTOR DEVICE HAVING AL-MN OR AL-MN-SI ALLOY ELECTRODES

BACKGROUND OF THE INVENTION

1. Field of the Invention

This invention relates to a semiconductor device and, more particularly, to a semiconductor device whose conductive layer for wiring exhibits good corrosion resistance.

2. Brief Description of the Prior Art

In semiconductor devices, pure Al and Al base alloys have heretofore been generally used for wiring for such reasons (1) that the materials can easily provide ohmic contact with a semiconductor element, (2) that they have a high degree of electric conductivity, (3) that they can be easily evaporated and etched, and (4) that they are inexpensive. Among the Al base alloys, Al-Si alloy is a particularly known alloy which enhances the reliability of an ohmic joint portion, and Al-Cu alloy is a known alloy which prevents disconnection (failure) attributed to electro-migration and thus enhances the reliability of the Al wiring.

However, where a semiconductor device employing pure Al, an Al-Si alloy or an Al-Cu alloy as a wiring material is plastic-encapsulated, it is sometimes the case that moisture or water vapor reaches the semiconductor device by diffusion in the plastics or along the interface between a lead frame and the plastic, and that corrosion takes place in an electrode portion which is not formed with a protective film or in a wiring portion in which a protective film has a defect due to any cause, with the result that the wiring is disconnected.

In general, the following five factors are important in the environment in which the aluminum of the wiring conductive layer in a semiconductor device is corroded.

(1) Moisture is present. (2) Halogen ions such as Cl ions are present. (3) Dissolved oxygen is present. (4) The aluminum is connected to a more noble metal than aluminum. (5) Since the Al wiring on the semiconductor is a thin film having a width of several to several tens of microns and a thickness of several $\mu$m or less, only a slight amount of corrosion will greatly influence the characteristics of the device unlike the case of the corrosion of usual bulky metals.

Prior-art semiconductor devices have been developed with little consideration given to the corrosive environment. It is, therefore, quite impossible to perfectly prevent the disconnection of the wiring conductive layer due to corrosion. Especially in the plastic-encapsulated semiconductor devices, defects due to corrosion of the wiring conductive layer frequently occur.

Corrosion of the wiring conductive layer of the semiconductor device presents aspects markedly different from those of the general corrosion on account of particularly the factors (4) and (5), so that the solution of the problem of corrosion has been difficult. More specifically, i) the geometries of the wiring conductive layer are very fine and especially the thickness is about 1 $\mu$m in some cases, and even a slight amount of corrosion being merely a local corrosion in the closest proximity to the surface in the case of the bulky material becomes a very serious corrosion causing the disconnection in the case of the wiring conductive layer. ii) Since the wiring conductive layer has a voltage applied thereto or a different kind of metal connected therewith, the corrosion phenomenon differs from the general one. As regards ii), for example, where Al is immersed in aqua pura or in an aqueous extract of epoxy resin, the weight decrease due to corrosion is more conspicuous in the immersion in aqua pura as to the corrosion of the Al as it is, whereas the corrosion rate is ten or more times greater in the immersion in the aqueous extract of epoxy resin as to the corrosion of the Al under the state under which Au is held in contact therewith or a voltage is applied thereto.

SUMMARY OF THE INVENTION

An object of this invention is to provide a semiconductor device in which there is very little disconnection of a conductive layer for wiring. Another object is to provide a semiconductor device which has excellent corrosion resistance of a conductive layer for wiring. Still another object is to provide a plastic-encapsulated semiconductor device which has excellent corrosion resistance of a conductive layer for wiring.

In order to accomplish these objects, the semiconductor device according to this invention has a wiring conductive layer made of an aluminum alloy which enhances the corrosion resistance remarkably and which renders the influences of the corrosive environment extremely slight. More specifically, the invention resides in a semiconductor device having a wiring conductive layer of a predetermined pattern which extends on an insulating film provided on a semiconductor substrate and which is connected with predetermined regions within the substrate via openings provided in the insulating film. The wiring conductive layer is made of an alloy which contains 0.05 percent by weight to 6 percent by weight of Mn, the remainder consisting essentially of Al.

The better corrosion resistance of the wiring conductive layer due to the addition of Mn is observed even when the quantity of Mn is 0.05 percent by weight or so, and a sufficient corrosionproof effect is demonstrated when the quantity of Mn exceeds 1 percent by weight. Especially in case where the wiring conductive layer made of the Al alloy was in contact with Au, when the quantity of Mn was below about 1 percent by weight, the corrosion proceeded easily without causing a film-like product on the surface of the wiring conductive layer in an aqueous solution of NaCl at 5 ppm (by weight) or in an epoxy resin extract solution in water at room temperature. Thus, the corrosion resistance was poor, and no favorable result was obtained. As is well known, the wiring conductive layer of a semiconductor device is often brought into contact with Au by the wire bonding, etc., and it is undersirable that the corrosion resistance be lowered in this case.

In a range in which the quantity of Mn in the Al alloy is up to 25 percent by weight, the corrosion-proof effect is greater as the quantity of Mn is larger. With an increase in the quantity of Mn, however, the specific resistance increases, that is, the conductivity lowers. In general, the conductivity of a material for the wiring conductive layer of the semiconductor device should be as high as possible. As is well known, the specific resistance of the wiring conductive layer of the semiconductor device may be up to about 5 times that of pure Al. For this reason, the quantity of Mn added to Al is limited to be not greater than 6 percent by weight.

As stated previously, as the quantity of Mn added to Al increases, the corrosion resistance becomes higher. It is, therefore, desirable that the quantity of Mn be greater insofar as the amount of 6 percent by weight is not exceeded. In general, accordingly, a preferable quantity of Mn is greater than 1.0 percent by weight and below 6 percent by weight; a more preferable quantity of Mn is 1.5 to 6 percent by weight, and the most preferable quantity of Mn is 2 to 6 percent by weight. However, where a high conductivity of the wiring conductive layer is especially desired, it is desirable that the Al alloy contain a quantity of Mn greater than 1.0 percent by weight and below 3.0 percent by weight.

The semiconductor material of the semiconductor device according to this invention is not specifically restricted. but it may be Si. Ge, a compound semiconductor such as GaAs and InSb, or any other semiconductor material serving the purpose of the particular device.

Also for the insulating film provided on the semiconductor substrate, there are used, for example, $SiO_2$, $Si_3N_4$ and $Al_2O_3$. These are not restrictive, but any insulating material may be used in accordance with the purpose of the particular device.

In this invention, the width and thickness of the wiring conductive layer are not specifically restricted, but they may be the same as the dimensions of the prior-art wiring conductive layers employing Al, the Al-Si alloy, the Al-Cu alloy, etc. Usually, the width and thickness of the prior-art wiring conductive layers are above several $\mu$m and below several $\mu$m, respectively, and most often they are above 10$\mu$m and 1 – 1.5 $\mu$m, respectively. The dimensions of the wiring conductive layer, however, may be designed in conformity with the purpose without being restricted to these numerical values. By way of example, a wiring conductive layer about 2$\mu$m wide has been designed.

Further, the geometries of the semiconductor substrate and the insulating film provided thereon of the semiconductor device according to the invention can be freely designed.

As described above, in this invention, there is no limitation on the materials and dimensions of the semiconductor substrate and the insulating film, and the dimensions of the wiring conductive layer can be the same as in the prior art, so that the invention is applicable to almost all present day semiconductor devices.

The wiring conductive layer according to the invention may also be made of an Al-Si-Mn alloy instead of an Al-Mn alloy. In this case, the content of Mn may be equal to that of the foregoing Al-Mn alloy, the Si content shall range from 0.8 percent by weight to 5 percent by weight, and the remainder shall consist essentially of Al. A preferable range of the Si content is 2 percent by weight to 3 percent by weight. When the Al-Si-Mn alloy is employed for the wiring conductive layer in this manner, a favorable result can be obtained, especially in case of the semiconductor substrate made of Si.

More specifically, where the semiconductor substrate is made of Si, the wiring conductive layer formed of pure Al has the problem that the alloying between Al and Si arises during the heat treatment for establishing the ohmic contact in an electrode portion of an element, so the reliability of the electrode portion decreases. In the case of an element having a thin diffused layer, the alloyed part breaks through the diffused layer, and hence, this difficulty becomes particularly conspicuous. Even in the case where the Al-Mn alloy is employed for the wiring conductive layer, this drawback is not eliminated. The wiring conductive layer employing the Al-Si-Mn alloy has the advantage that, not only the corrosion resistance is remarkably enhanced, but also the alloying of the electrode portion in the case of employing the Si substrate is suppressed, the degradation of the reliability being preventable.

Where the quantity of Si of the Al-Si-Mn alloy is less than 0.8 percent by weight, the effect of preventing the degradation of the reliability of the electrode portion cannot be expected. In case where it exceeds 5 percent by weight, photoetching and wire bonding are difficult. Both cases are unfavorable. This is well known as to Al-Si alloy, and it has been revealed that the same applies to Al-Si-Mn alloy. A preferable quantity of Si at which both the enhancement of the reliability of the electrode portion and an easy photoetching can be sufficiently expected is 2 – 3 percent by weight.

DETAILED DESCRIPTION

Embodiment 1

A substrate was prepared in such a way that an $SiO_2$ film of a thickness of 5,000 A was formed on an Si wafer by thermal oxidation. An Al-(1.8 percent by weight) Mn alloy thin film 1 $\mu$m thick was formed on the substrate by the vacuum evaporation by resistance heating. For the sake of comparison, an Al film of the same thickness was also formed. For both the Al and the Al-Mn alloy, the evaporation conditions were 200° C for the substrate temperature, 2 to 20 × $10^{-6}$ Torr degree of vacuum in a bell jar in the course of evaporation, and an evaporation rate of 200 A/sec. In the case of the Al-Mn alloy, Al and Mn, weighed to provide the desired composition, were placed on a tungsten boat. In the evaporation equipment, they were heated up to a temperature just above the melting point of the Al-Mn alloy and formed an alloy bath. Thereafter, the boat was heated by resistance heating up to a temperature providing the predetermined evaporation rate, and the evaporation was carried out. The composition of the Al-Mn alloy thin film obtained was quantitatively analyzed with an X-ray microanalyzer.

Figure 1:
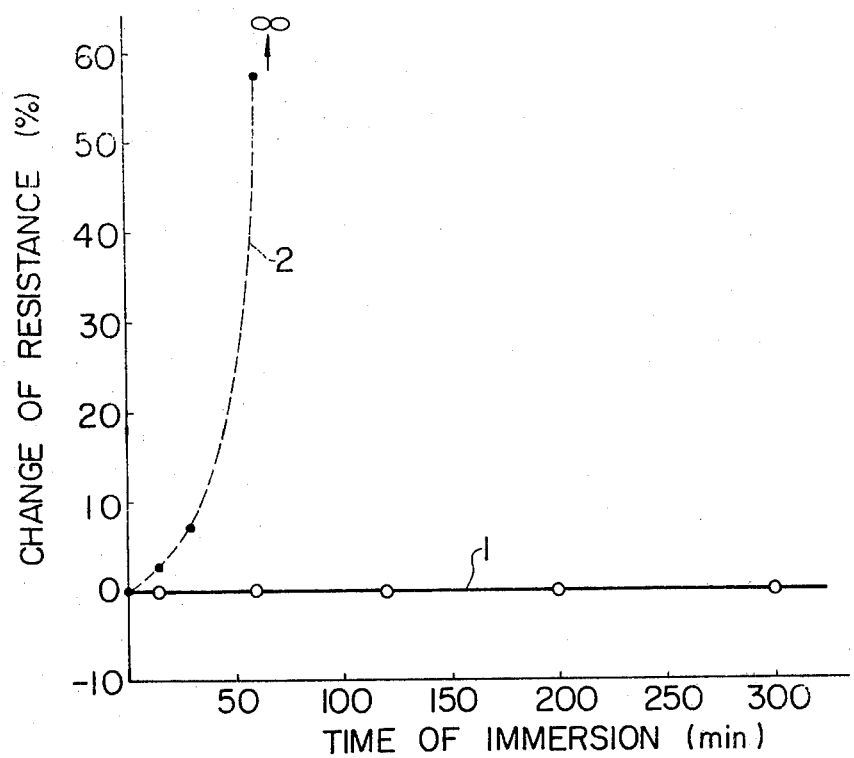
FIG. 1 is a graph showing changes of electric resistances in the case where a thin film of Al and a thin film of an Al alloy containing 1.8 percent by weight of Mn were immersed in an aqueous solution of NaCl at a concentration of 5 ppm.

Next, the corrosion resistances of the thin films were evaluated in terms of electric resistance changes. The Al and Al-Mn thin films obtained by the above method were formed into four-terminal patterns for electrical resistance measurement by the well-known photoetching process. The dimensions were 100 μm in the line width and 1 mm in the distance between the terminals for resistance measurement. The four terminals had Au wires connected thereto by the thermocompression bonding, to obtain a specimen for the corrosion resistance measurement. Subsequently, an aqueous solution of NaCl at a concentration of 5 ppm, (by weight, and the same applies hereinafter) was prepared. The specimen for the corrosion resistance measurement was immersed therein, and changes of the electric resistance of the specimen due to corrosion were measured. Typical examples of the changes are illustrated in FIG. 1. In the figure, solid line 1 indicates the electric resistance change characteristic of the Al-(1.8 percent by weight) Mn alloy thin film while broken line 2 indicates that of the pure Al thin film. As can be seen from FIG. 1, the Al-Mn alloy thin film is corrosion resistant remarkably longer than pure Al thin film.

Figure 2A:
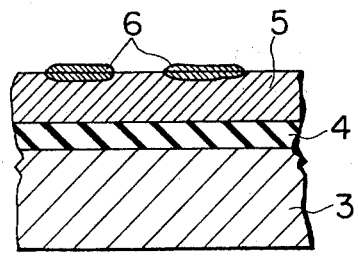
FIG. 2a and 2b are schematic views showing sections of the Al-Mn alloy thin film and the Al thin film subjected to the corrosion test, respectively.
Figure 2B:
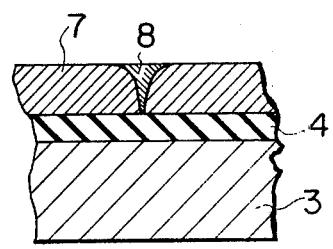

Model diagrams of the results of the observations of the states under which surface films were produced by the corrosion are shown in FIG. 2a and FIG. 2b. FIG. 2a is a sectional view of the Al-Mn alloy thin film, while FIG. 2b is a sectional view of the pure Al thin film. In the figures, numeral 3 designates an Si wafer, numeral 4 an $SiO_2$ film, numeral 5 an Al-Mn alloy thin film, numeral 6 a surface film produced on the alloy thin film 5 during the corrosion test, numeral 7 a pure Al thin film, and numeral 8 the corrosion product formed in the film 7 during the corrosion test. As is apparent from FIG. 2b, the pure Al thin film is disconnected because corrosion easily penetrates to the underlying $SiO_2$ film 4. This is similar to the case when the underlying material was Si. In the case of the Al-Mn alloy thin film, the film is formed on the surface, and corrosion penetration to the underlying material is retarded.

The reason why the aqueous solution of NaCl at 5 ppm was employed for the corrosion resistance measurement is as stated below. The Cl-ion concentration of a resin extract solution obtained by throwing 10gr. of a resin for the encapsulation of a semiconductor device into 100 ml. of boiling water is about 10 ppm. in terms of NaCl. The Cl-ion concentration of a resin extract solution obtained by employing water at room temperature is below about 1 ppm in terms of NaCl. The Cl-ion concentration, 5 ppm of the NaCl aqueous solution is the medium concentration. The specified concentration bestows a corrosion action similar to a corrosion phenomenon in an actual resin-encapsulated semiconductor device, but it can be said to be rather more severe than the actual corrosive condition.

Embodiment 2

By the same method as in Embodiment 1, there were prepared a substrate with an Al-Mn alloy thin film deposited thereon and substrates for comparisons with Al-Mg alloy, Al-Ge alloy, Al-Si alloy and pure Al thin films deposited thereon. Au wires were connected to the thin films. Corrosion resistance tests were carried out in such a way that the substrates were immersed and let stand in an epoxy resin extract solution at room temperature for 30 minutes. The results are given in Table 1.

Table 1

| Thin Film Material | Quantity of Added Element (percent by weight) | Corrosion Resistance |
|---|---|---|
| Al-Mn | 0.04 | x |
|  | 0.5 | x |
|  | 1.0 | o |
|  | 1.2 | o |
|  | 1.8 | o |
|  | 5.0 | o |
|  | 6.0 | o |
| Al-Mg | 2.5 | x |
|  | 7.4 | x |
| Al-Ge | 1.0 | x |
|  | 6.0 | x |
| Al-Si | 2.7 | x |
| Al | 0 | x |

The epoxy resin extract solution used here was obtained by throwing 10 gr. of finely pulverized epoxy resin into 100 ml. of aqua pura at about 20° C and then letting the solution to stand for about 1 hour. The determination of corrosion resistance was mainly based on whether or not the corrosion penetrated to the $SiO_2$ film of the underlying material, and "acceptance" is denoted by o and "rejection" by x in Table 1. It can be seen from the table that alloys in which at least Mn is added to Al within the range of about 1.0 percent by weight and below 6.0 percent by weight are corrosion-proof.

The epoxy resin employed is 'RM 253C' (trade name) produced by Hitachi Kasei Kabushiki-Kaisha. It has been verified that substantially the same results are obtained with other epoxy resins.

From the results for the present embodiment, it has been revealed that even the Al-Mg alloy which exhibits excellent corrosion resistance in case of a bulk material is poorly resistant to corrosion when employed for the wiring conductive layer of a semiconductor device. That is, a mere diversion of such known corrosion-proof material for a semiconductor device does not bring forth a favorable result.

The Al-Mn alloy thin films whose corrosion resistances in the resin extract solution were good demonstrated corrosionproof effects against solutions containing halogen ions such as Cl and Br ions.

Embodiment 3

Figure 3:
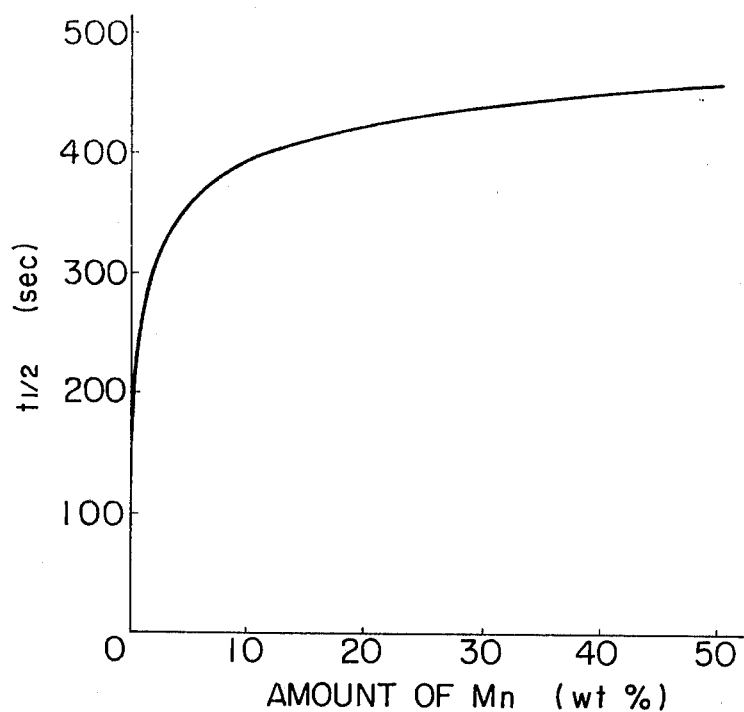
FIG. 3 is a graph showing the relationship between the corrosion resistance and the Mn content of Al-Mn alloy thin films.

By the same method as in Embodiment 1, there were prepared substrates with Al alloy thin films deposited thereon. Au wires were connected to the thin films. The specimen was immersed in an aqueous solution of NaCl at 100 ppm. (by weight) at a temperature of 60° C. Further, an external power source was connected to maintain the potential of the specimen at a fixed positive potential (+2.5 V with respect to the Au reference electrode) and to induce electrolytic corrosion in the specimen. Changes of the corrosion current with the lapse of time were observed. At first, the corrosion current increased gradually. After reaching $I_{max}$, it decreased comparatively rapidly. After decreasing down to $I_{min}$, it reached a substantially constant value. The relationship between $t_{1/2}$ which denotes a period of time for the corrosion current to reach $$\frac{I_{max} + I_{min}}{2}$$

and the quantity of Mn of the Al-Mn alloy constituting the thin film was investigated. The result is shown in FIG. 3. For reference, $t_{1/2}$ in the case where the specimen is a pure Al thin film is also shown in the figure. A greater value of $t_{1/2}$ signifies a more excellent corrosion resistance. As is apparent from the figure, the improvement in corrosion resistance of the Al alloy thin film due to the addition of Mn is noted where the quantity of Mn is as slight as about 0.05 percent by weight. Where 1 percent by weight is exceeded, the improvement becomes remarkable. With a further increase in the quantity of Mn, the corrosion resistance is enhanced. When the quantity of Mn further increases from about 6 percent by weight, the enhancement of the improvement of the corrosion resistance begins to saturate, but the corrosion resistance is still enhanced with an increase in the quantity of Mn.

Figure 4:
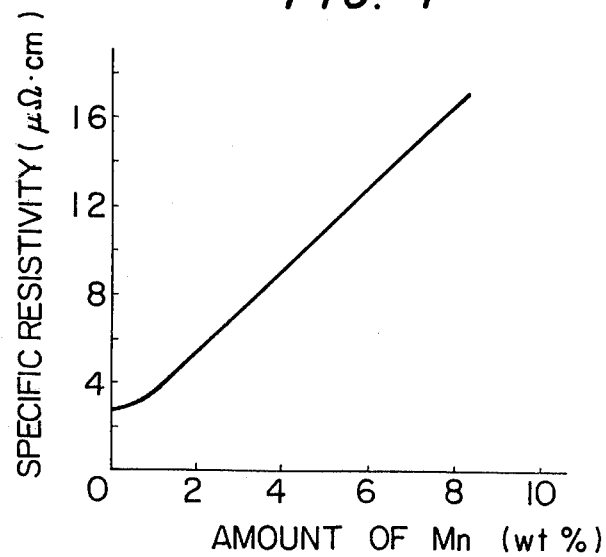
FIG. 4 is a graph showing the relationship between the Mn content and the specific resistance of the Al-Mn alloy thin films.

Subsequently, the same specimens as used in the above corrosion resistance test had their specific resistances at room temperature measured. The relationship between the specific resistance and the quantity of Mn of the Al-Mn alloy forming the thin film is illustrated in FIG. 4. It is desirable that the conductivity of the wiring material be as high as possible. As is shown in FIG. 4, however, the addition of Mn increases its specific resistance. Although the allowable specific resistance differs in dependence on the type semiconductor device to which the wiring material is applied, the limitation on the specific resistance is thought to be generally about 5 times the specific resistance of pure Al, especially when a minute wiring pattern having a width of about 2 $\mu$m is considered. Therefore, the upper limit of the amount of addition of Mn is 6 percent by weight or so. The lower limit of the amount of Mn can be said to be 0.05 percent by weight or so for which an improvement in corrosion resistance is observed.

Embodiment 4

Figure 5:
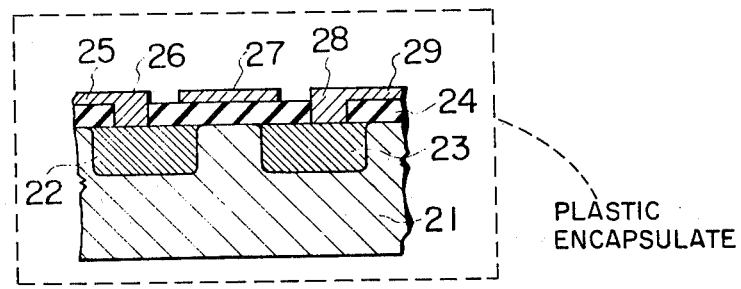
FIG. 5 is a sectional view of a semiconductor device according to one embodiment of this invention.

A very common MOS-FET (metal-oxide-semiconductor field effect transistor) element with a structure shown in FIG. 5 was fabricated by employing an Al-Mn alloy containing 3 percent by weight of Mn as the material of electrodes and wirings. The ohmic contact characteristic, the threshold voltage and the source-drain reverse bias voltage characteristic of the element were measured. As a result, it has been revealed that the characteristics do not differ from those in the case of employing pure Al as the material of the electrodes and wirings. It is, accordingly, apparent that the Al alloy which is used for the wiring conductive layer in this invention is sufficiently applicable to the wiring of a semiconductor device. The thickness of the wiring was 1.2 $\mu$m, and the width was 10 $\mu$m at a minimum.

In FIG. 5, numeral 21 designates a p-type Si substrate, numerals 22 and 23 $n^+$ source and drain regions, respectively, numeral 24 an $SiO_2$ film, numeral 25 a wiring connected to the source electrode, numeral 26 the source electrode, numeral 27 the gate electrode, numeral 28 the drain electrode, and numeral 29 a wiring connected to the drain electrode. The parts 25, 26, 27, 28, and 29 were made of the Al-Mn alloy.

EMBODIMENT 5

On an LSI (large scale integrated circuit) composed of the MOS-FET elements as in Embodiment 4, an Al-(2 percent by weight) Mn alloy thin film was formed as a conductive layer for wiring. In order to simply control the composition, the evaporation process adopted was a three-temperature process which controls the heating temperatures of an Al evaporation source, an Mn evaporation source and a substrate, respectively. The elements obtained were resin-encapsulated. Thereafter, an accelerated test in the state in which the specimen was let stand under a high temperature and a high humidity and an accelerated test in the state in which a voltage was applied to the specimen under high temperature and high humidity were carried out, and the percent defective was investigated. Thus, a reliability test in the case of employing the Al-Mn alloy thin film for a semiconductor device was conducted. The results are given in Table 2. For the sake of comparison, a case of employing pure Al for the wiring conductive layer is also indicated.

Table 2

| Test Conditions | Material of Wiring Conductive Layer Al | Al-2 (percent by weight) Mn |
|---|---|---|
| temperature 65° C, humidity 90 %, let to stand for 1,000 hrs. | percent defective 0 % | percent defective 0 % |
| 65° C, 90 %, 2,000 hrs. | 2 % | 0 % |
| 85° C, 85 %, 1,000 hrs. under application of 30 V | 5 % | 0 % |
| 85 ° C, 85 %, 2,000 hrs. under application of 30 V | 64 % | 1 % |

It can be seen from the table that, where the Al-Mn alloy thin film is used for the wiring, the reliability is excellent.

The thickness of the wiring was 1.2 $\mu$m, the width was 10 $\mu$m at the minimum, and the resin for the encapsulation was epoxy resin ('RM 253C' produced by Hitachi Kasei Kabushiki-Kaisha).

EMBODIMENT 6

On Si wafers formed with the high breakdown voltage MOS-FET as in Embodiment 4, three kinds of metals for wiring conductive layers of Al, Al-1.5 percent by weight Si and Al-2 percent by weight Mn-3 percent by weight Si were formed by a vacuum evaporation process. The first two were fabricated for comparisons. The evaporation conditions were 3 - 20 × $10^{-6}$ torr of vacuum during evaporation, a substrate temperature of 150° - 350° C, 1 $\mu$m - 3 $\mu$m for the thickness of the evaporated film, and an evaporation rate of 150 - 250 A/sec. Al was evaporated by resistance heating of a tungsten boat on which it was placed, Si by the electron beam evaporation process, and Al-Mn by the resistance heating of a tungsten boat on which the Al-Mn alloy of the desired composition was placed. Subsequently, a wiring pattern was formed by the known photoetching process. Thereafter, an $SiO_2$ film 3,000 A thick was adhered to the entire area of the wafer by chemical vapor deposition. Further, feed-through etching for removing $SiO_2$ of wire bonding parts was conducted and the wafer was split into desired chips. The chip was die-bonded through an Au layer to a kovar plate, whereupon an Au wire was connected thereto by nail head bonding.

Further, the resultant structure was encapsulated with the epoxy resin ('RM 253C' produced by Hitachi Kasei Kabushiki-Kaisha), to obtain a specimen for corrosion resistance evaluation.

As corrosion resistance tests, a standing test at a temperature of 65° C and a humidity of 95% and a continuous 65 V-voltage application test at a temperature of 85° C and a humidity of 85% were conducted, and the rate of occurrence of disconnection was investigated. The results are given in Table 3.

Table 3

| Material of Wiring Conductive Layer | Rate of Occurrence of Corrosive Disconnections due to Standing for Fixed Time at 65 °C and 95 % RH. | Rate of Occurrence of Corrosive Disconnections after lapse of Fixed Time under 65V Application at 85° C and 85 % RH. |
|---|---|---|
| pure Al | 2/1000 | 83/1000 |
| Al-1.5% by wt. Si | 1/1000 | 97/1000 |
| Al-2% by wt. Mn-3% by wt.-Si | 0/1000 | 16/1000 |

It can be seen from Table 3 that the thin film of the Al-Mn-Si series alloy has a longer life in comparison with those of Al and Al-Si in both the standing test and the voltage application test. Similar corrosion resistance tests were conducted by variously changing the quantity of Si between 0.8 percent by weight and 5 percent by weight and that of Mn between 0.05 percent by weight and 10 percent by weight. It has been found that the corrosion resistance depends on the Mn content more than on the Si content. When Mn is contained by at least 0.05 percent by weight, the corrosion resistance is apparently enhanced.

EMBODIMENT 7

Specimens were prepared in such a way that thin films about 1 μm thick and made of Al-Mn-Si alloys in which the Si content was fixed at 1.5 percent by weight and in which the amount of addition of Mn was varied were deposited onto Si wafers having SiO₂ films by the vacuum evaporation, as in Embodiment 6. The specimens were immersed in an aqueous solution of NaCl at a concentration of 10 ppm., and the periods of time until etch pits were formed were measured. The specific resistances of the thin films were also measured. The results are given in Table 4.

Table 4

| Amount of Mn (percent by weight) | Time Required to Form Etch Pits (min.) | Specific Resistivity ($\mu\Omega$- cm) |
|---|---|---|
| 0 | 0.2 | 2.7 |
| 0.1 | 5 | 2.8 |
| 1.1 | 30 | 3.9 |
| 1.6 | 30 | 5.1 |
| 1.8 | 30 | 5.3 |
| 6.0 | 30 | 13.5 |

In this case, the corroded states were observed. Then it was clearly recognized that the alloys whose Mn contents exceeded 1 percent by weight produced films on their surfaces and that their corrosions did not proceed so as to penetrate to the underlying SiO₂ films. In this manner, the materials in which Mn in an amount of greater than 1 percent by weight and below 6 percent by weight and Si in an amount of from 0.8 to 5 percent by weight are added to Al are especially advantageous in that when they are used as the wiring materials, no disconnection occurs even if corrosion occurs.

As described previously, the specific resistance of the wiring conductive layer of the semiconductor device is up to about 5 times that of pure Al. Therefore, it is apparent from Table 4 that the upper limit of the Mn content of the Al-Si-Mn alloy forming the wiring conductive layer in this invention is about 6 percent by weight.

EMBODIMENT 8

The present embodiment relates to the reliability enhancement in the electrode portion of an element. On the (100) plane surface of an Si wafer an SiO₂ layer, 5,000 A thick, was deposited by thermal oxidation. Subsequently, electrode holes 3 μm-square to 30 μm-square were photoetched in the SiO₂ layer. Next, three kinds of metals for wiring conductive layers of Al, Al-1.5 percent by weight Si and Al-1.5 percent by weight Mn-2 percent by weight Si were formed by vacuum evaporation by the same method as in Embodiment 6. The first two were prepared for comparison. Patterns were subsequently formed by photoetching Al, Al-Si and Al-Mn-Si into long strips having a length of 150 μm and widths of from 6 μm to 40 μm in conformity with the sizes of the electrode holes. The specimens obtained were heat-treated in an atmosphere of N₂ in a temperature range of 400° – 550° C for various periods of time. The depths of quadrangular pyramid-like pits due to the alloying produced in the electrode hole portions by the heat treatment were measured by oblique polishing. The results are illustrated in FIG. 6.

Figure 6:
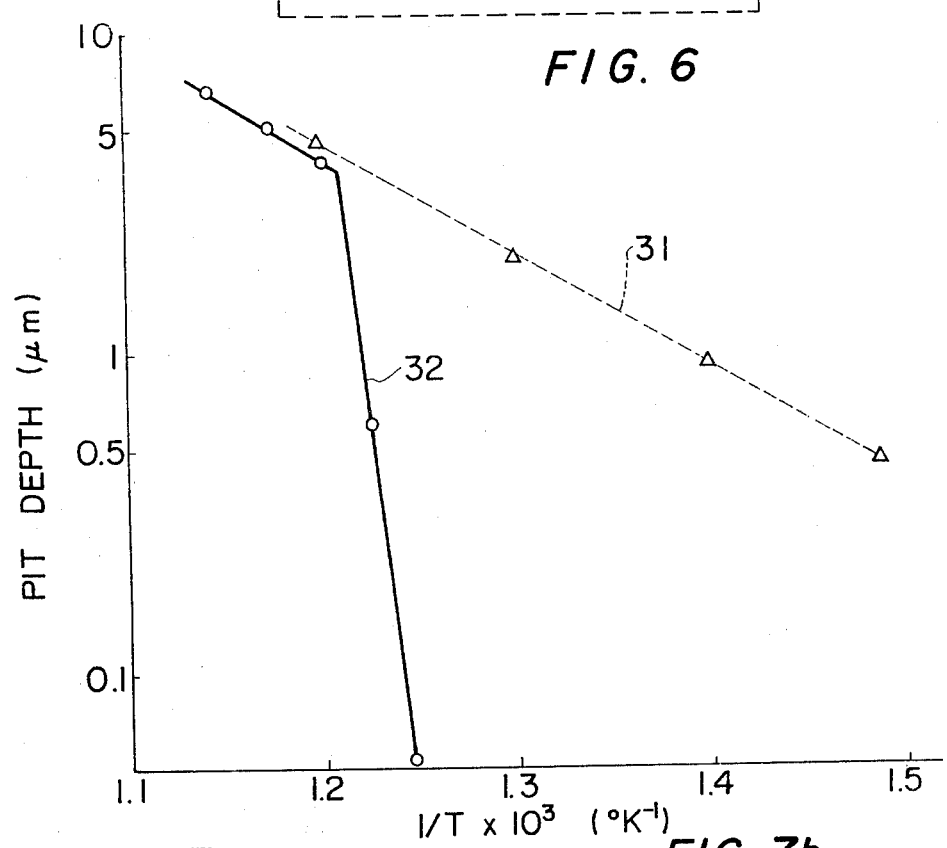
FIG. 6 is a graph showing the relationship between the pit depth and the heat treatment temperature in contact portions of an Al thin film and an Al-Si-Mn alloy thin film with an Si substrate.

FIG. 6 corresponds to a case where the heat treatment period was 30 minutes, and it provides an Arrhenius-plot of the pit depths in the logarithmic scale versus the inverse of the heat treatment temperatures T. Broken line 31 represents the case of Al, and solid line 32 the case of Al-1.5 percent by weight Mn-2 percent by weight Si. As can be seen from FIG. 6, Al created a pit of about 5,000 A when subjected to the heat treatment of 400° C for 30 minutes, whereas the pit depth of the Al-1.5 percent by weight Mn-2 percent by weight Si was below 500 A being the measurement limit even when the alloy was heat-treated at 520° C for 30 minutes. In the case of the Al-1.5 percent by weight Si alloy, substantially the same results as in the Al-Mn-Si alloy were obtained.

In this manner, where the Al-Si-Mn alloy is employed for the wiring conductive layer, not only enhancement of the corrosion resistance but also prevention of the degradation of the reliability of the electrode portion due to the heat treatment can be expected.

Embodiment 9

Figure 7A:
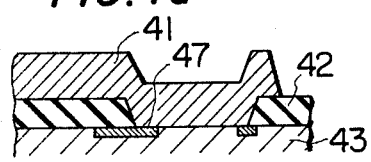
FIGS. 7a – 7d are schematic views of the states of alloying contact portions between an Al thin film an Al-Si alloy thin film and an Al-Si-Mn alloy thin film and an Si substrate.
Figure 7B:
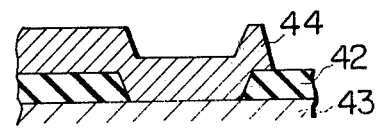
Figure 7C:
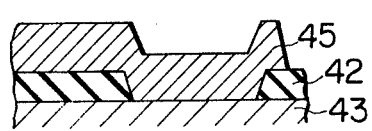
Figure 7D:
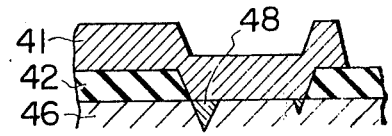

Using Si wafers whose surfaces were in the (111) plane, specimens as in Embodiment 8 were prepared. In order to investigate the alloying in the electrode portions of the respective elements, sections in the vicinity of the electrode portions were observed with a microscope. The results are schematically illustrated in FIGS. 7a – 7c. Wiring conductive layers 41, 44 and 45 in FIG. 7a, FIG. 7b and FIG. 7c are made of pure Al, Al-1.5 percent by weight Si and Al-1.5 percent by weight Mn-2 percent by weight Si, respectively. FIG. 7d shows an electrode portion in the case where a wiring conductive layer of pure Al was deposited onto an Si wafer whose surface was in the (110) plane and where the resultant wafer was heat-treated. In the figures, numeral 41 designates an Al thin film, numeral 42 an SiO₂ layer, numeral 43 a Si single-crystal wafer having its surface in the (111) plane, numeral 44 an Al-Si alloy thin film, numeral 45 the Al-Mn-Si alloy thin film, numeral 46 a Si single-crystal wafer having its surface in the (100) plane, and numerals 47 and 48 alloyed parts. When Al containing no Si was used for the wiring conductive layer, the alloying was as follows.

In the case of the Si wafer whose surface was in the (111) plane, the alloying proceeded parallel to the Si wafer surface as indicated at 47 in FIG. 7a. In the case of the Si wafer whose surface was in the (100) plane, the alloying proceeded in the form of a quadrangular pyramid as indicated at 48 in FIG. 7d. On the other hand, when the Al-Si alloy or the Al-Mn-Si alloy was used for the wiring conductive layer, the situation was as follows.

In the case of the Si wafer whose surface was in the (111) plane, alloying due to the heat treatment hardly occurred, as is apparent from FIGS. 7b and 7c. This was similar to the case of the Si wafer having its surface in the (100) plane. Accordingly, the Si semiconductor device employing the Al-Mn-Si alloy thin film as the wiring conductive layer has excellent corrosion resistance and, moreover, it does not give rise to the alloying of the electrode portion due to the heat treatment.

Embodiment 10

Experiments as in Embodiments 8 and 9 were conducted by varying the quantity of Si in the Al-Mn-Si alloy of the wiring conductive layer within a range of 0.6 – 5 percent by weight and the quantity of Mn within a range of 0.05 – 7 percent by weight. As a result, the following were revealed. The alloying of the electrode portion is principally concerned with the Si content. Where the amount of Si is 1 percent by weight, no alloying occurs even when the heat treatment is conducted at 420° C for 30 minutes, and alloying takes place abruptly when the heat treatment temperature exceeds 430° C. Although the heat treatment temperature for obtaining an ohmic junction differs in dependence on the type of semiconductor device, it is about 400° C in the lowest temperature region. In practical use, accordingly, a Si content of 0.8 percent by weight at which any alloying product was not formed at 400° C becomes the lower limit. Description will now be made of the upper limit of the Si content.

If Si is contained in an amount of or above 2 percent by weight, the alloying does not arise even when the heat treatment is conducted at 520° C for 30 minutes. Thus, an amount of 2 – 3 percent by weight is the optimum as the Si content. On the other hand, even if the Si content is greater than 3 percent by weight, no inconvenience occurs due to the suppression of the alloying. Therefore, even when Si is contained in an amount somewhat larger than 2 – 3 percent by weight in case of controlling the Si content, the alloying can be simply and reliably suppressed. However, as the Si content increases, there arise such difficulties in the photoetching that Si residue remains at the photoetching and that the reflection factor of the Al-Si material lowers. For this reason, the upper limit of the Si content is 5 percent by weight in practical use. In the Embodiments 1, 2, 3 and 7, the descriptions on the electrode hole portions have been omitted, for brevity.

As explained above in connection with the embodiments, the semiconductor device which uses the Al-Mn alloy thin film or the Al-Si-Mn alloy thin film as the wiring material has excellent corrosion resistance, and it is very useful for enhancing the reliability of the film.

We claim:

1. In a semiconductor device which has a conductive wiring layer having a predetermined pattern which extends on an insulating film provided on a semiconductor substrate and which is connected with predetermined regions within said substrate via openings provided in said insulating film, the improvement wherein said conductive wiring layer is made of material selected from the group consisting of an alloy having a composition containing 0.05 – 6 percent by weight of Mn, the remainder being composed essentially of Al, and an alloy having a composition containing 0.05 – 6 percent by weight of Mn and 0.8 – 5 percent by weight of Si, the remainder being composed essentially of Al.

2. The semiconductor device according to claim 1, wherein said conductive wiring layer is made of an alloy containing 0.05 – 6 percent by weight of Mn, the remainder being composed essentially of Al.

3. The semiconductor device according to claim 2, wherein the quantity of Mn is greater than 1.0 percent by weight but below 6 percent by weight.

4. The semiconductor device according to claim 2, wherein the quantity of Mn is 1.5 – 6 percent by weight.

5. The semiconductor device according to claim 2, wherein the quantity of Mn is 2 – 6 percent by weight.

6. The semiconductor device according to claim 2, wherein the quantity of Mn is greater than 1.0 percent by weight but below 3.0 percent by weight.

7. The semiconductor device according to claim 1, wherein said conductive wiring layer is made of an alloy containing 0.05 – 6 percent by weight of Mn and 0.8 – 5 percent by weight of Si, the remainder being composed essentially of Al.

8. The semiconductor device according to claim 7, wherein the quantity of Mn is greater than 1.0 percent by weight but below 6 percent by weight.

9. The semiconductor device according to claim 7, wherein the quantity of Mn is 1.5 – 6 percent by weight.

10. The semiconductor device according to claim 7, wherein the quantity of Mn is 2 – 6 percent by weight.

11. The semiconductor device according to claim 7, wherein the quantity of Mn is greater than 1.0 percent by weight but below 3.0 percent by weight.

12. The semiconductor device according to claim 1, wherein said conductive wiring layer is made of an alloy containing 0.05 – 6 percent by weight of Mn and 2 – 3 percent by weight of Si, the remainder being composed essentially of Al.

13. The semiconductor device according to claim 1, wherein said semiconductor device is plastic-encapsulated.

14. The semiconductor device according to claim 7, wherein said semiconductor substrate is made of single crystal silicon.

15. The semiconductor device according to claim 8, wherein said semiconductor substrate is made of single crystal silicon.

16. The semiconductor device according to claim 3, wherein said semiconductor device is plastic-encapsulated.

17. The semiconductor device according to claim 8, wherein said semiconductor device is plastic-encapsulated.

18. The semiconductor device according to claim 3, wherein said conductive wiring layer is in contact with Au.

19. The semiconductor device according to claim 8, wherein said conductive wiring layer is in contact with Au.

* * * * *